(12) United States Patent
Chou (10) Patent No.: US 6,825,790 B2
(45) Date of Patent: Nov. 30, 2004

(54) LOW POWER CONSUMPTION PIPELINED ANALOG-TO-DIGITAL CONVERTER

(75) Inventor: Kuo-Yu Chou, Taoyuan (TW)

(73) Assignee: Airoha Technology Corporation, Taoyuan (TW)

( * ) Notice: Subject to any disclaimer, the term of this patent is extended or adjusted under 35 U.S.C. 154(b) by 0 days.

(21) Appl. No.: 10/234,469

(22) Filed: Sep. 5, 2002

(65) Prior Publication Data

US 2003/0193425 A1 Oct. 16, 2003

(30) Foreign Application Priority Data

Apr. 12, 2002 (TW) ........................................ 91107470 A (51) Int. Cl.[7] .............................. H03M 1/38; H03M 1/06
(52) U.S. Cl. ........................................ 341/161; 341/118
(58) Field of Search ................................ 341/161, 118, 341/120, 158, 159, 162, 155, 156; 330/9

(56) References Cited

U.S. PATENT DOCUMENTS

| | | | | |
|---|---|---|---|---|
| 5,572,212 A | * | 11/1996 | Levinson et al. ............ | 341/162 |
| 5,867,116 A | * | 2/1999 | Nakamura et al. .......... | 341/159 |
| 6,222,471 B1 | * | 4/2001 | Nagaraj ...................... | 341/120 |
| 6,232,898 B1 | * | 5/2001 | Nagaraj ...................... | 341/120 |
| 6,441,769 B1 | * | 8/2002 | Nagaraj ...................... | 341/161 |
| 6,577,185 B1 | * | 6/2003 | Chandler et al. .............. | 330/9 |
| 6,710,735 B1 | * | 3/2004 | Lin ............................. | 341/161 |
| 6,753,801 B2 | * | 6/2004 | Rossi .......................... | 341/161 |

* cited by examiner

Primary Examiner—Patrick Wamsley
(74) Attorney, Agent, or Firm—Ladas & Parry LLP (57) ABSTRACT

This present invention is directed to a stage circuit for a pipelined analog-to-digital converter. The stage circuit includes an amplifier, a comparator, a first compensator and a second compensator, and three modes are developed for the stage circuit in signal processing: a sampling mode, a first amplifying mode and a second amplifying mode. In the sampling mode, the amplifier is inputted with an analog input signal; the comparator compares the analog input signal with a reference signal, and then generates a first digital output code. In the first amplifying mode, the first compensator selectively adds a first compensation value to the analog input signal according to the first digital output code, and then generates a first input signal; the amplifier amplifies the first input signal and then generates a first output signal; the comparator compares the first output signal with the reference signal and then generates a second digital output signal. In the second amplifying mode, the first compensator selectively adds a second compensation value to the analog input signal according to the first digital output code and the second digital output code, and then generates a second input signal; the amplifier amplifies the second input signal and then generates a second output signal; the second compensator selectively chooses a third compensation value according to the first digital output code and the second digital output code, and the third compensation value is amplified and added to the second output signal to generate an analog output signal which sends to the next stage circuit.

32 Claims, 8 Drawing Sheets

FIG. 1 The Prior Art

FIG. 2 The Prior Art

| Input signal range | The first digital output code $b_{2i-1}$ | The second digital output code $b_{2i}$ | The sampling mode ||||  The first amplifying mode ||| 
|---|---|---|---|---|---|---|---|---|
| | | | The first compensator | The second compensator | The first switch | The first compensator | The second compensator | The first switch |
| 0.875~1 Vref | 10 | 10 | 0.5Vin | Vcom | a | 0.25Vref | Vcom | a |
| 0.75~0.875 Vref | 10 | 10 | 0.5Vin | Vcom | a | 0.25Vref | Vcom | a |
| 0.625~0.75 Vref | 10 | 10 | 0.5Vin | Vcom | a | 0.25Vref | Vcom | a |
| 0.5~0.625 Vref | 10 | 01 | 0.5Vin | Vcom | a | 0.25Vref | Vcom | a |
| 0.375~0.5 Vref | 10 | 00 | 0.5Vin | Vcom | a | 0.25Vref | Vcom | a |
| 0.25~0.375 Vref | 10 | 10 | 0.5Vin | Vcom | a | Vcom | Vcom | a |
| 0.125~0.25 Vref | 01 | 01 | 0.5Vin | Vcom | a | Vcom | Vcom | a |
| 0~0.125 Vref | 01 | 01 | 0.5Vin | Vcom | a | Vcom | Vcom | a |
| 0~-0.125 Vref | 01 | 00 | 0.5Vin | Vcom | a | Vcom | Vcom | a |
| -0.125~-0.25 Vref | 01 | 10 | 0.5Vin | Vcom | a | -0.25Vref | Vcom | a |
| -0.25~-0.375 Vref | 00 | 01 | 0.5Vin | Vcom | a | -0.25Vref | Vcom | a |
| -0.375~-0.5 Vref | 00 | 01 | 0.5Vin | Vcom | a | -0.25Vref | Vcom | a |
| -0.5~-0.625 Vref | 00 | 00 | 0.5Vin | Vcom | a | -0.25Vref | Vcom | a |
| -0.625~-0.75 Vref | 00 | 00 | 0.5Vin | Vcom | a | -0.25Vref | Vcom | a |
| -0.75~-0.875 Vref | 00 | 00 | 0.5Vin | Vcom | a | -0.25Vref | Vcom | a |
| -0.875~-1 Vref | 00 | 00 | 0.5Vin | Vcom | a | -0.25Vref | Vcom | a |

FIG. 9

| Input signal range | The first digital output code $b_{2i-1}$ | The second digital output code $b_{2i}$ | The second amplifying mode ||| |
|---|---|---|---|---|---|
| | | | The first compensator | The second compensator | Thd first switch |
| 0.875~1 Vref | 10 | 10 | 0.25Vref | 0.25Vref | Vcom |
| 0.75~0.875 Vref | 10 | 10 | 0.25Vref | 0.25Vref | Vcom |
| 0.625~0.75 Vref | 10 | 10 | 0.25Vref | 0.25Vref | Vcom |
| 0.5~0.625 Vref | 10 | 01 | 0.25Vref | Vcom | Vcom |
| 0.375~0.5 Vref | 10 | 01 | 0.25Vref | Vcom | Vcom |
| 0.25~0.375 Vref | 10 | 00 | Vcom | 0.25Vref | Vcom |
| 0.125~0.25 Vref | 01 | 10 | Vcom | 0.25Vref | Vcom |
| 0~0.125 Vref | 01 | 01 | Vcom | Vcom | Vcom |
| 0~-0.125 Vref | 01 | 00 | Vcom | -0.25Vref | Vcom |
| -0.125~-0.25 Vref | 01 | 10 | Vcom | -0.25Vref | Vcom |
| -0.25~-0.375 Vref | 00 | 01 | -0.25Vref | Vcom | Vcom |
| -0.375~-0.5 Vref | 00 | 01 | -0.25Vref | Vcom | Vcom |
| -0.5~-0.625 Vref | 00 | 00 | -0.25Vref | -0.25Vref | Vcom |
| -0.625~-0.75 Vref | 00 | 00 | -0.25Vref | -0.25Vref | Vcom |
| -0.75~-0.875 Vref | 00 | 00 | -0.25Vref | -0.25Vref | Vcom |
| -0.875~-1 Vref | 00 | 00 | -0.25Vref | -0.25Vref | Vcom |

LOW POWER CONSUMPTION PIPELINED ANALOG-TO-DIGITAL CONVERTER

FIELD OF THE INVENTION

This present invention relates to an analog-to-digital converter and more particularly, to a pipelined analog-to-digital converter.

BACKGROUND OF THE INVENTION

Flash, two-step, interpolating, folding and pipelined are the common types of a high-speed analog-to-digital converter. These types of converters compare input signal with reference signals directly and output digital bits in parallel connection. These types of converters work fast, however the resolution is poor because of superficial measure and power consumption. The limitation of resolution is usually designed from 8 to 10 bits.

The flash converter is the fastest of the above-mentioned high-speed analog-to-digital converters. The resolution would be raised by increasing the amount of comparators in the exponent of 2. The relationship between the amount of comparator N and the resolution B is: $N=2^B-1$. When the resolution is over 8, the number of comparators would be more than 500, and the superficial measure and power consumption of the entire circuit would be very large. Therefore, the resolution of flash converter is limited within 6 to 8 bits.

Because there are too many comparators in a flash converter, other types of high-speed converter are developed. In the types, pipelined analog-to-digital converter has the least elements, so it becomes the main stream in the application of the high-speed analog-to-digital converter.

Figure 1:
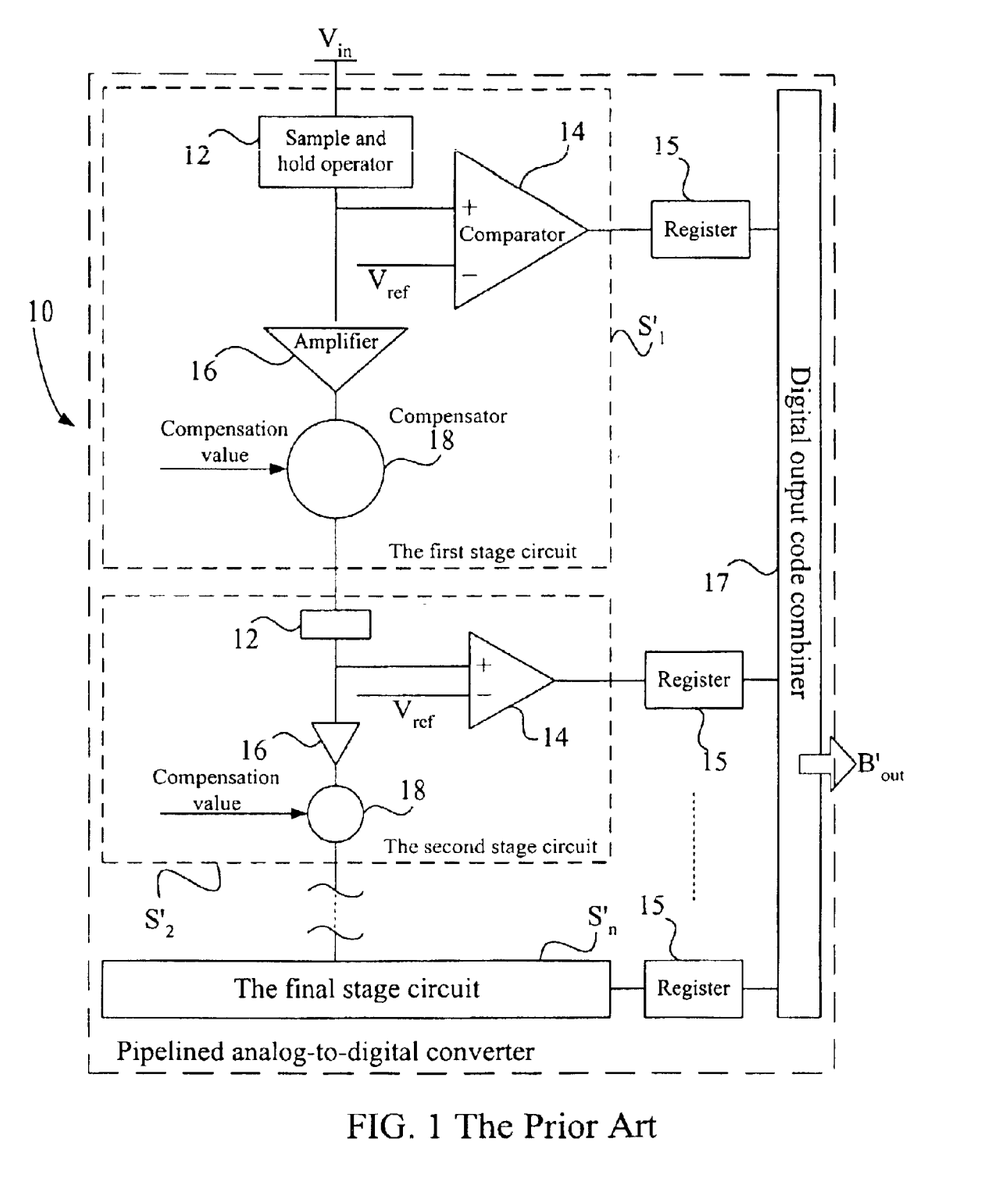
FIG. 1 is a schematic diagram of a pipelined analog-to-digital converter according to the prior art.
Figure 2:
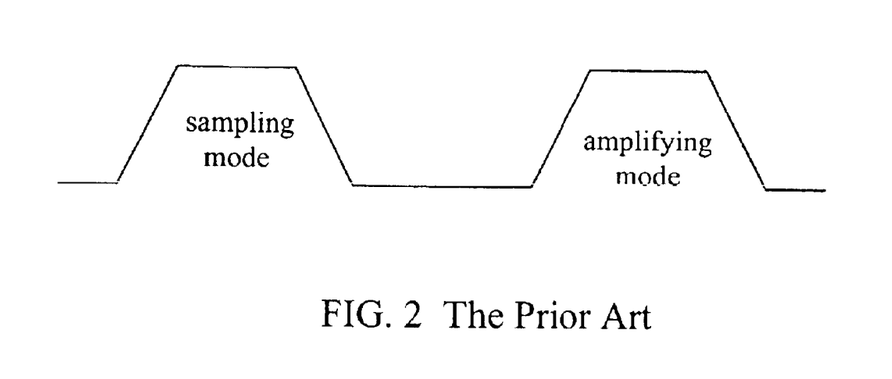
FIG. 2 is a timing diagram of a stage circuit according to the prior art.

Please refer to FIG. 1 and FIG. 2. FIG. 1 is the schematic diagram of the pipelined analog-to-digital converter according to the prior art. FIG. 2 is the timing diagram of stage circuit in the pipelined analog-to-digital converter according to the prior art. The pipelined analog-to-digital converter 10 according to the prior art comprises a plurality of stage circuits $S'_i$ (i=1~n), a register 15 and a digital output code combiner 17. Each stage circuit $S'_i$ according to the prior art comprises a sample and hold operator 12, a comparator 14, an amplifier 16 and a compensator 18. The stage circuit $S'_i$ according to the prior art converts the analog input signal to the digital output signal in two modes: a sampling mode and an amplifying mode.

The operation principle of the pipelined analog-to-digital converter 10 according to the prior art is described as follows. When an external analog signal $V_{in}$ is inputted into the first stage circuit $S'_1$ of the pipelined analog-to-digital converter 10, the first stage circuit $S'_1$ enters the sampling mode. The sample and hold operator 12 samples the analog signal $V_{in}$ at sampling time. Moreover, compares sampling signal of the analog signal $V_{in}$ with a predetermined reference signal $V_{ref}$ of the comparator 14 to generate a digital output code. After that, the stage circuit then enters the amplifying mode. In the amplifying mode, the amplifier 16 amplifies the analog signal $V_{in}$. The compensator 18 adds a compensation value to the amplifying analog signal $V_{in}$ according to the digital output code obtained by comparator 14. After that, the processed analog signal is transmitted to the second circuit $S'_2$.

The following stage circuits repeat the above-mentioned steps. The last stage circuit executes only the sampling mode and compares the analog signal with the reference signal without amplifying. The digital output codes of each stage circuit temporary store in a register 15. When the last stage circuit outputs digital output codes, a digital output code combiner 17 combines the digital output codes to generate the digital signal $B'_{out}$ corresponding to the analog signal $V_{in}$.

Wherein, the resolution K of each stage circuit is based on the number of reference signals in the comparator. If each resolution is 1 bit, the reference signal of the comparator would be $\pm V_{ref}/4$. The amplification factor G of the amplifier in the stage circuit would be confirmed with the confirmation of the resolution. The relationship is $G=2^K$.

Every stage circuit has the sample and hold operator 12 so that they could work at the same time. For example, the second stage circuit simultaneously deals with the analog signal that the first stage circuit inputs into sample and hold operator and transmits the analog signal to the third stage circuit. Therefore, besides the latency at the beginning, the pipelined analog-to-digital converter outputs a result of converting every clock period just as the flash analog to digital converter does.

There are several stage circuits needed in the pipelined analog-to-digital converter that leads to a great number of amplifiers if the resolution of each stage circuit is one bit. 10 bits pipelined analog-to-digital converter needs 9 stages; therefore, 19 comparators and 8 amplifiers are needed. The more amplifiers, the more power consumption. Once the resolution of stage circuits is raised, the power requirement of amplifier and comparator in each stage circuit would be also raised, and it is difficult to lower the power consumption of the entire pipelined analog-to-digital converter. Thus, a new structure of stage circuit that can lower the power consumption of the entire pipelined analog-to-digital converter is needed.

SUMMARY OF INVENTION

One objective of the present invention is to provide a pipelined analog-to-digital converter for reducing every two stage circuits of the prior art into one stage circuit. The converter of this present invention contains fewer elements and keeps the efficiency. The converter still executes the mission of converting well.

Another objective of the present invention is to provide a pipelined analog-to-digital converter with fewer elements. The power consumption of the converter decreases by reducing the number of the amplifiers.

The present invention provides a pipelined analog-to-digital converter comprising a plurality of stage circuit for receiving an external analog signal, and converting the analog signal via a plurality of pipelined stage circuits to output a digital signal in responsive to the analog signal. Each stage circuit comprises an amplifier, a comparator, a first compensator and a second compensator for converting the inputted analog signal via a sampling mode, a first amplifying mode and a second amplifying mode.

In the sampling mode, the amplifier receives an analog input signal. The comparator compares the analog input signal with a reference signal to generate a first digital output code.

In the first amplifying mode, the first compensator selectively adds a first compensation value to the analog input signal according to the first digital output code, and then generates a first input signal. The amplifier amplifies the first input signal and then generates a first output signal. The comparator compares the first output signal with the reference signal and then generates a second digital output code.

In the second amplifying mode, the first compensator selectively adds a second compensation value to the analog input signal according to the first digital output code and the second digital output code, and then generates a second input signal. The amplifier amplifies the second input signal, and then generates a second output signal. The second compensator selectively chooses a third compensation value according to the first digital output code and the second digital output code. Then the third compensation value is amplified and added to the second output signal to generate an analog output signal that is sent to the next stage circuit.

These and other objects of the present invention will no doubt become obvious to those of ordinary skill in the art after reading the following detailed description of the preferred embodiment, which is illustrated in the various figures and drawings.

DETAILED DESCRIPTION OF THE INVENTION

An objective of the present invention is to provide a pipelined analog-to-digital converter for reducing two stage circuits of the prior art into one stage circuit. The converter of the present invention has fewer elements and keeps the efficiency. The power consumption of the converter decreases by reducing the number of the amplifiers.

Figure 3:
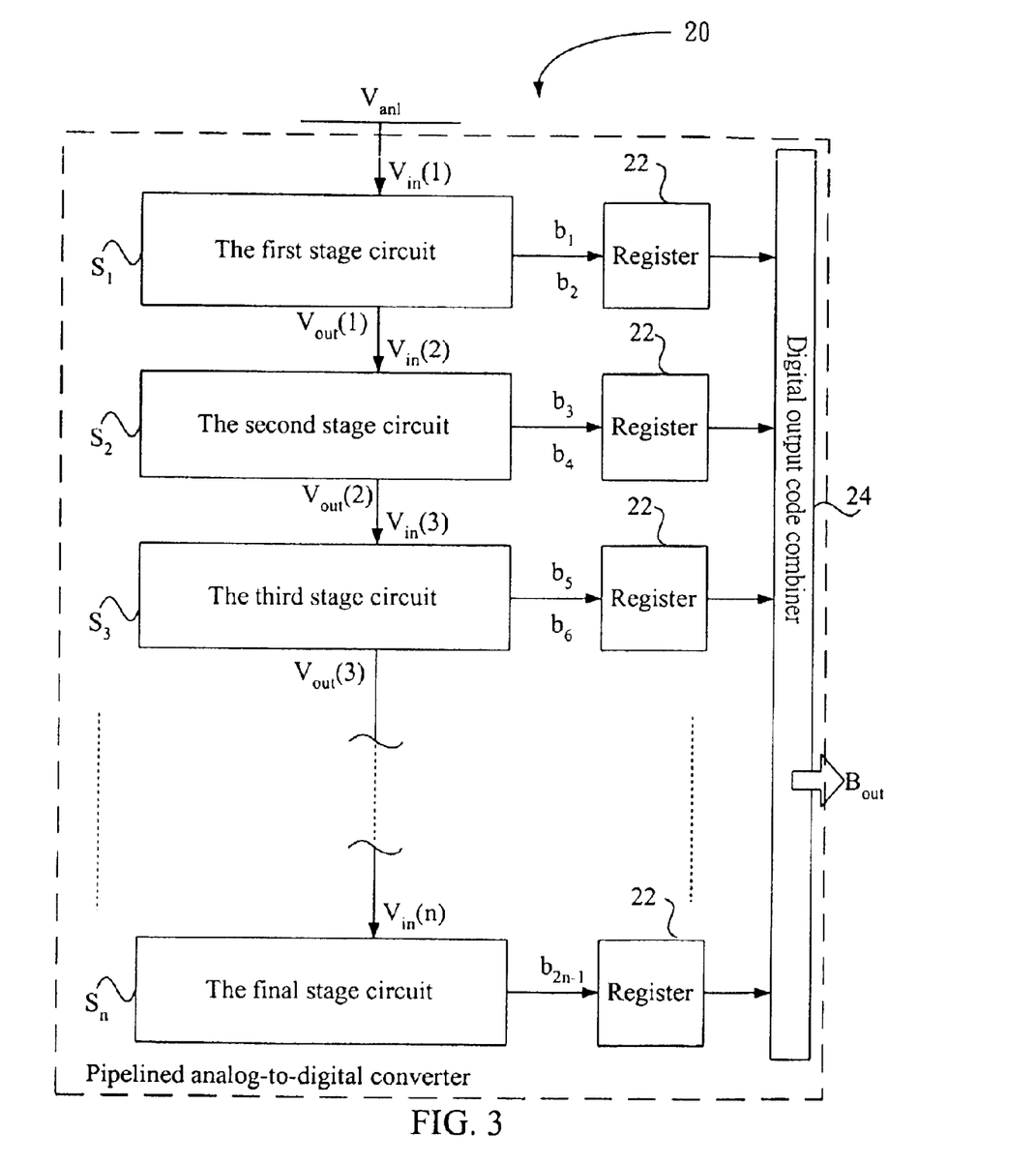
FIG. 3 is a schematic diagram of a pipelined analog-to-digital converter according to the present invention.

Please refer to FIG. 3. FIG. 3 is the schematic diagram of a pipelined analog-to-digital converter according to the present invention. The present invention provides a pipelined analog-to-digital converter 20 comprising n pipelined stage circuits $S_i$ (i=1~n), n registers 22 and a digital output code combiner 24. N pipelined stage circuits $S_i$ convert an analog signal $V_{an1}$ into 2n-1 digital output codes $b_1$, $b_2$, ... $b_{2n-1}$. The register 22 temporarily stores the 2n-1 digital output codes $b_1$, $b_2$, ... $b_{2n-1}$ generated by each stage circuit. The digital output code combiner 24 combines the 2n-1 digital output codes $b_1$, $b_2$, ..., $b_{2n-1}$ and outputs the corresponding digital signal $B_{out}$. Wherein the analog signal $V_{an1}$ is the analog input signal $V_{in}$ (1) of the first stage circuit $S_1$.

Figure 4:
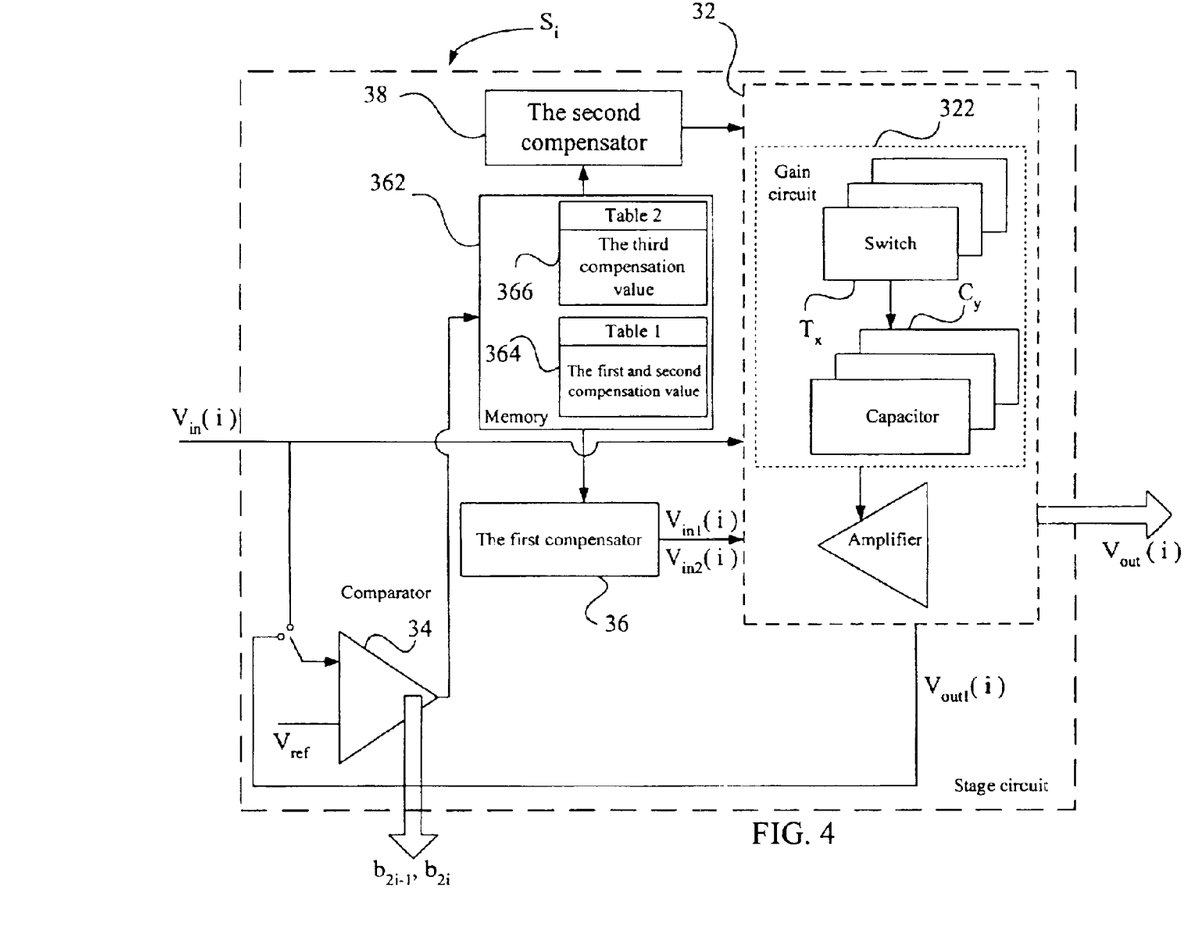
FIG. 4 is a schematic diagram of a stage circuit $S_i$ according to the present invention.
Figure 5:
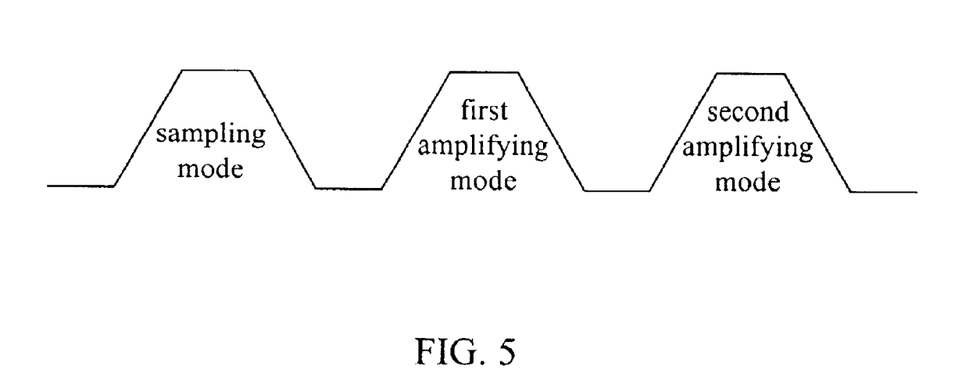
FIG. 5 is a timing diagram of a stage circuit $S_i$ dealing with an analog input signal according to the present invention.

Please refer to FIG. 4 and FIG. 5. FIG. 4 is the schematic diagram of a stage circuit $S_i$ according to the present invention, and FIG. 5 is the timing diagram of a stage circuit $S_i$ dealing with an analog input signal of the present invention. Each stage circuit $S_i$ of the present invention comprises an amplifier 32, a comparator 34, a first compensator 36 and a second compensator 38 for converting the analog signal $V_{an1}$ inputted into the pipelined analog-to-digital converter 20 via a sampling mode, a first amplifying mode and a second amplifying mode.

In the sampling mode, the amplifier 32 receives an analog input signal $V_{in}(i)$ The comparator 34 compares the analog input signal $V_{in}$ (i) with a predetermined reference signal $V_{ref}$ to generate a first digital output code $b_{2(i)-1}$. The number of the reference signals in a comparator defines the resolution of stage circuit Si. If the resolution of each stage is 1 bit, the reference signal of a comparator is $\pm V_{ref}/4$. The $V_{ref}$ is defined by the request of the converter.

In the first amplifying mode, the first compensator 36 selectively adds a first compensation value to the analog input signal $V_{in}$ (i) according to the first digital output code $b_{2(i)-1}$ to generate a first input signal $V_{in1}$ (i). The amplifier 32 amplifies the first input signal $V_{in1}$ (i) to generate a first output signal $V_{out1}$ (i). The comparator 34 compares the first output signal $V_{out1}$ (i) with the reference signal $V_{ref}$ to generate a second digital output signal $b_{2(i)}$.

In the second amplifying mode, the first compensator 36 selectively adds a second compensation value to the analog input signal $V_{in}$ (i) according to the first digital output code $b_{2(i)-1}$ and the second digital output code $b_{2(i)}$ to generate a second input signal $V_{in2}$ (i). The amplifier 32 amplifies the second input signal $V_{in2}$ (i) to generate a second output signal $V_{out2}$ (i). The second compensator 38 selectively chooses a third compensation value according to the first digital output code $b_{2(i)-1}$ and the second digital output code $b_{2(i)}$. The third compensation value is amplified and added to the second output signal $V_{out2}$ (i) to generate an analog output signal $V_{out}$ (i) sent to the next stage circuit $S_{i+1}$ to be the analog input signal $V_{in}$ (i+1).

In particular, repeating n-i stage circuits, the invention outputs 2n-2 digital output codes $b_1$, $b_2$, ..., $b_{2n-2}$, and generates an analog output signal $V_{out}(n-1)$ to the nth stage circuit. After the n-th stage circuit receives the input of the analog input signal $V_{in}(n)$ (the same as the above analog output signal $V_{out}(n-1)$), the n-th stage just enter the sampling mode but not the first amplifying mode and the second amplifying mode. The n-th stage circuit only compares the analog input signal $V_{in}(n)$ with the reference signal $V_{ref}$, and generates the first digital output code $b_{2n-1}$ of the n-th stage circuit. Finally, the pipelined analog-to-digital converter of the present invention outputs 2n-1 digital output codes being combined to be the digital signal $B_{out}$.

The way to convert 2n-1 digital output codes into digital signal $B_{out}$ according to the prior art is to sum up every digital output code in turns. For example, if the first digital output code is 10 and the second digital output code is 10, the digital signal would be 110(10+10) that means to sum up the first number of the next digital output code and the last number of the previous digital output code. By the way, the digital signal outputted by the pipelined analog-to-digital converter could be obtained. If a reference signal $V_{ref}$ of a comparator is changed, it only needs to modify applicable and would not influence the digital signal outputted by the pipelined analog-to-digital converter.

The amplifier 32 of the invention comprises a gain circuit 322. The gain circuit 322 comprises a plurality of switches $T_x$ and a plurality of capacitors $C_y$ that the numbers of X and Y are based on the arrangement of the circuit. The plurality of switches $T_x$ selectively conducts the plurality of capacitors $C_y$ to individually decide the amplification factor of the amplifier in the sampling mode, the first amplifying mode and the second amplifying mode.

The pipelined analog-to-digital converter of the present invention also comprises a memory 362 for recording the first compensation table 364 and the second compensation table 366. The first compensation table records the first compensation value corresponding to the first digital output code, and the second compensation value corresponding to the first digital output code and the second digital output code. The second compensation table records the third compensation value corresponding to the first digital output code and the second digital output code. The first compensation table and the second compensation table could be combined depending on the actual need and the principle of the present invention.

Figure 6:
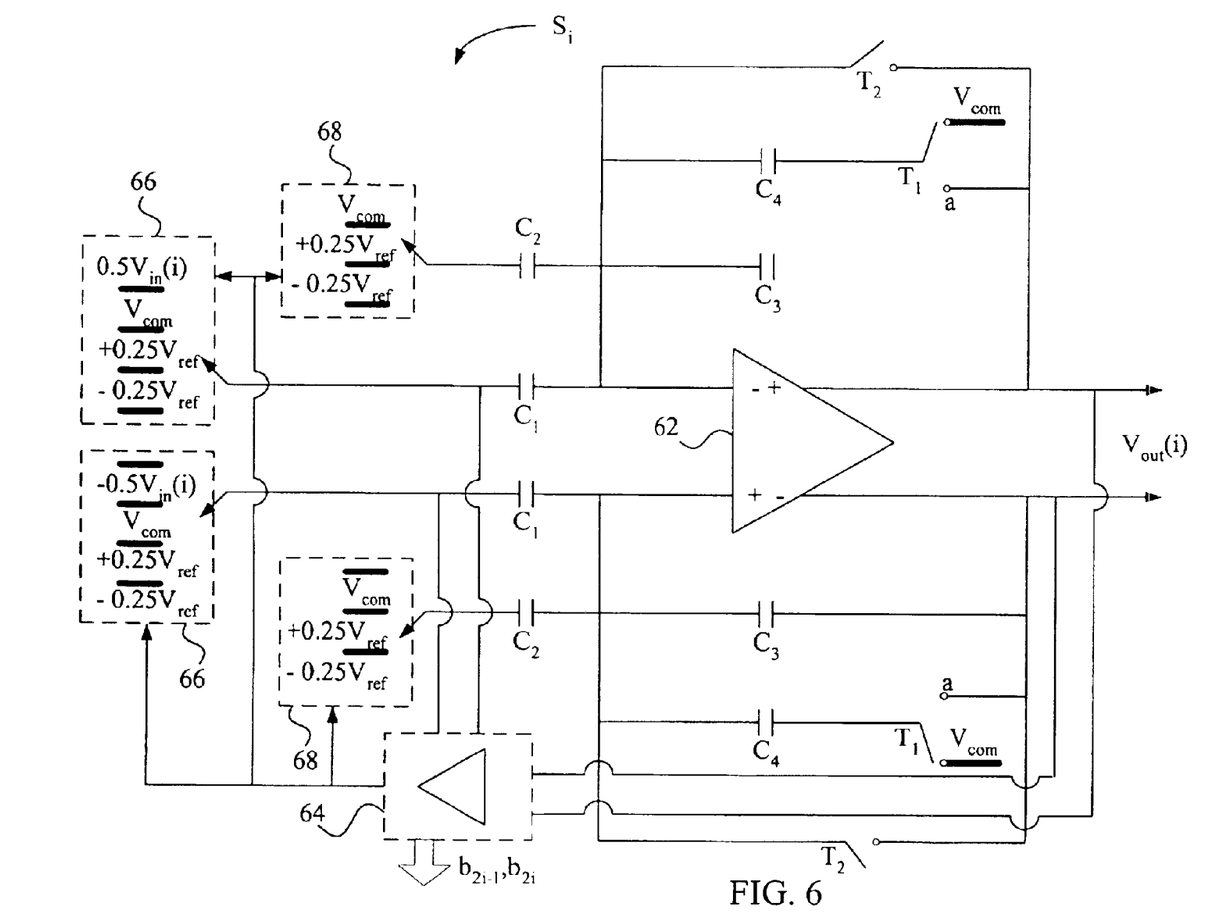
FIG. 6 is a schematic diagram of the preferred embodiment according to the present invention.

What follows is a preferred embodiment of the present invention. Please refer to FIG. 6. FIG. 6 is a schematic diagram of the preferred embodiment according to the present invention. The stage circuit of this preferred embodiment comprises an amplifier 62, a first capacitor $C_1$, a second capacitor $C_2$, a third capacitor $C_3$, a fourth capacitor $C_4$, a first switch $T_1$, a second switch $T_2$, a comparator 64, a first compensator 66 and a second compensator 68. Wherein the ratio between the first capacitor $C_1$, the second capacitor $C_2$, the third capacitor $C_3$ and the fourth capacitor $C_4$ is 4:2:1:1.

In particular, the preferred embodiment of the present invention is connected by a differential mode. When a first compensator connected to a negative input terminal (−) of an amplifier switches to a certain compensation value, the first compensator connected to a positive input terminal (+) of an amplifier switches to the minus of corresponding certain compensation value. The second compensator is in the same way. Wherein the $V_{com}$ of the present invention is 1.65 volt. The description of the signal dealing focuses on the alternating current signal and ignores the DC value. The following description of the principle of the stage circuit $S_i$ is based on the element of a negative input terminal of an amplifier in the preferred embodiment of the invention.

What follows is the operation principle of the stage circuit $S_i$ of the preferred embodiment. At first, in the sampling mode, the second switch $T_2$ conducts, and the second compensator switches to $V_{com}$. Under the differential mode, the second capacitor $C_2$ is ground connection and has no influence on the entire circuit. At the same time, an analog input signal $V_{in}(i)$ is inputted into the first capacitor $C_1$ (the first compensator switches to 0.5 $V_{in}$), and the comparator 64 compares the analog input signal $V_{in}(i)$ with the reference signal $\pm V_{ref}/4$ to generate a first digital output code $b_{2(i)-1}$. The comparison method is as follows. If $V_{in}(i)>+V_{ref}/4$, the first digital output code $b_{2(i)-1}$ is 10; if $-V_{ref}/4<V_{in}(i)<+V_{ref}/4$, the first digital output code $b_{2(i)-1}$ is 01; if $V_{in}(i)<-V_{ref}/4$, the first digital output code $b_{2(i)-1}$ is 00. In particular, the $V_{ref}$ in the preferred embodiment of the invention is 0.5 volt. The reference volt (+0.25 $V_{ref}$, −0.25 $V_{ref}$) of the compensation method is its difference with $V_{com}$, not its actual electrical voltage.

Then, go on the first amplifying mode. According to the first digital output code $b_{2(i)-1}$, the first compensator 66 selectively switches to a first compensation value and compensates the analog input signal $V_{in}(i)$ by adding the first compensation value to the first capacitor $C_1$ to generate the first input signal $V_{in1}(i)$. The method of compensation is as follows. If the first digital output code $b_{2(i)-1}$ is 10, the first compensator 66 switches to +0.25 $V_{ref}$; if the first digital output code $b_{2(i)-1}$ is 01, the first compensator 66 switches to $V_{com}$; if the first digital output code $b_{2-1}$ is 00, the first compensator 66 switches to −0.25 $V_{ref}$.

Meanwhile, the second compensator 68 switches to $V_{com}$. The second capacitor $C_2$ is ground connection under the differential mode, and has no influence on the entire circuit. The first switch $T_1$ connects to point a. Therefore, the fourth capacitor is in parallel connection with the third capacitor, but in series connection with the first capacitor. The capacitor ratio of the first capacitor and (the fourth capacitor +the third capacitor) is 2:1. By the way, the amplifier 62 amplifies the first input signal $V_{in1}(i)$ by two to generate a first output signal $V_{out1}(i)$. Meanwhile, the comparator 64 compares the first output signal $V_{out1}(i)$ with the reference signal $\pm V_{ref}/4$ to generate a second digital output code $b_{2(i)}$. The comparison method is as follows. If $V_{out1}(i)>+V_{ref}/4$, the second digital output code $b_{2(i)}$ is 10; if $-V_{ref}/4<V_{out1}(i)<+V_{ref}/4$, the second digital output code $b_{2(i)}$ is 01; if $V_{out1}(i)<-V_{ref}/4$, the second digital output code $b_{2(i)}$ is 00.

Figure 8:
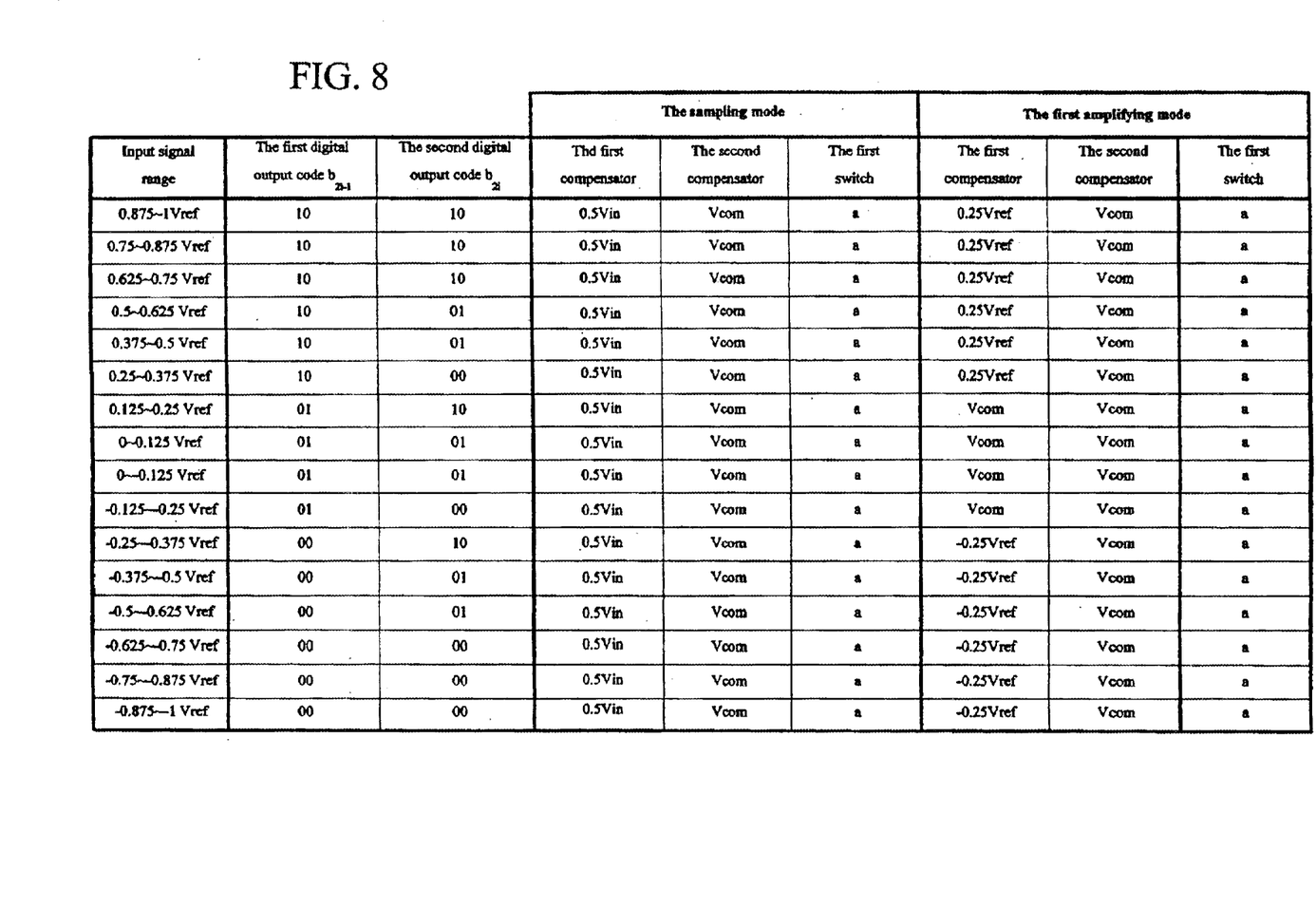
FIG. 8 is a table of the first compensation value and the second compensation value selection table.

Finally, in the second amplifying mode, according to the first digital output code b2i−1 and the second digital output code b2i, the first compensator 66 switches to a second compensation value and compensates the analog input signal Vin(i) by adding the second compensation value to the first capacitor C1 to generate the second input signal Vin2($i$). The comparison method is as follows. If the first digital output code b2i−1 is 10 and the second digital output code b2i is 10, the first compensator 66 switches to +0.25 Vref; if the first digital output code b2i−1 is 10 and the second digital output code b2i is 01, the first compensator 66 switches to +0.25 Vref; if the first digital output code b2i−1 is 10 and the second digital output code b2i is 00, the first compensator 66 switches to Vcom; if the first digital output code b2i−1 is 01 and the second digital output code b2i is 10, the first compensator 66 switches to Vcom; if the first digital output code b2i−1 is 01 and the second digital output code b2i is 01, the first compensator 66 switches to Vcom; if the first digital output code b2i−1 is 01 and the second digital output code b2i is 00, the first compensator 66 switches to Vcom; if the first digital output code b2i−1 is 00 and the second digital output code b2i is 10, the first compensator 66 switches to Vcom; if the first digital output code b2i−1 is 00 and the second digital output code b2i is 01, the first compensator 66 switches to −0.25 Vref; if the first digital output code b2i−1 is 00 and the second digital output code b2i is 00, the first compensator 66 switches to −0.25 Vref. As for the relation of the first compensator for choosing the first compensation value and the second compensation value according to the first digital output code and the second digital output code, please refers to the table 1 in FIG. 8. FIG. 8 is a table of the first compensation value and the second compensation value selection table.

At this time, the first switch $T_1$ switches to $V_{com}$. Thus, the fourth capacitor $C_4$ turns into a broken circuit, and the third capacitor $C_3$ is still in series with the capacitor $C_1$. The capacitor ratio between the first capacitor and the third capacitor is 4:1. The amplifier 62 amplifies the second input signal $V_{in2}(i)$ by four to generate a second output signal $V_{out2}(i)$.

Meanwhile, the second compensator 68 switches to a third compensation value according to the first digital output code b2i−1 and the second digital output code b2i, and inputs the third compensation value into the second capacitor C2. The amplifier 62 amplifies the third compensation value and adds to the second output signal Vout2($i$) to generate an analog output signal Vout(i) to the next stage circuit Si+1. Wherein the comparison method is as follows.

Figure 9:
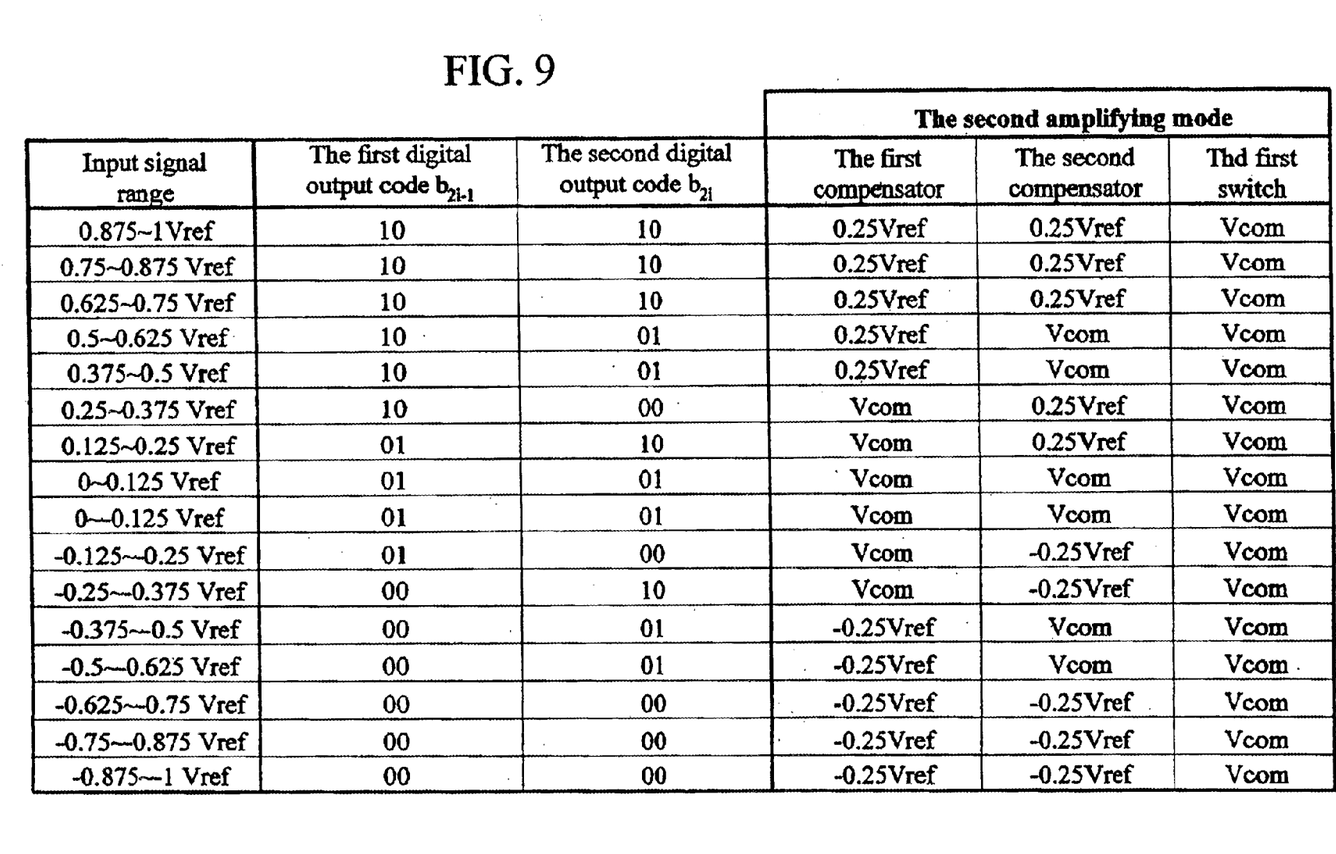
FIG. 9 is a table of the third compensation value selection table.

If the first digital output code b2$i$–1 is 10 and the second digital output code b2$i$ is 10, the second compensator 68 switches to +0.25 Vref; if the first digital output code b2$i$–1 is 10 and the second digital output code b2$i$ is 01, the second compensator 68 switches to Vcom; if the first digital output code b2$i$–1 is 10 and the second digital output code b2$i$ is 00, the second compensator 68 switches to +0.25 Vref; if the first digital output code b2$i$–1 is 01 and the second digital output code b2$i$ is 10, the second compensator 68 switches to +0.25 Vref; if the first digital output code b2$i$–1 is 01 and the second digital output code b2$i$ is 01, the second compensator 68 switches to Vcom; if the first digital output code b2$i$–1 is 01 and the second digital output code b2$i$ is 00, the second compensator 68 switches to –0.25 Vref; if the first digital output code b2$i$–1 is 00 and the second digital output code b2$i$ is 10, the second compensator 68 switches to –0.25 Vref; if the first digital output code b2$i$–1 is 00 and the second digital output code b2$i$ is 01, the second compensator 68 switches to Vcom; if the first digital output code b2$i$–1 is 00 and the second digital output code b2$i$ is 00, the second compensator 68 switches to –0.25 Vref. As for the relation of the second compensator for choosing the third compensation value according to the first digital output code and the second digital output code, please refers to the table in FIG. 9. FIG. 9 is a table of the third compensation value selection table.

Figure 7:
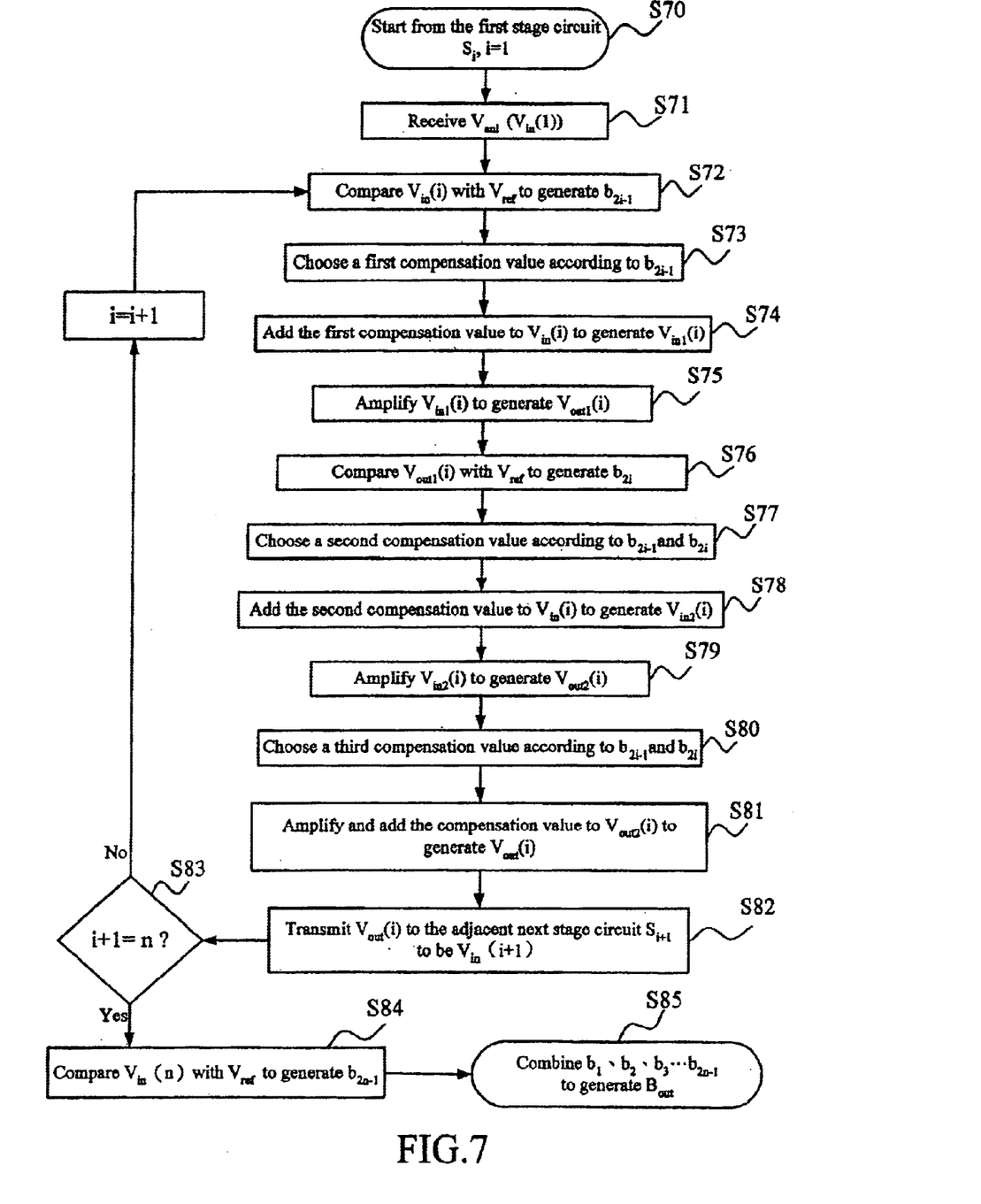
FIG. 7 is a flow chart of the converting method according to the present invention.

Sum up the above description, the method of the present invention for converting an analog signal to a corresponding digital signal is described as follows. Please refer to FIG. 7. FIG. 7 is the flow chart of the converting method according to the present invention. The method of converting an analog signal to a digital signal according to the present invention comprises the following steps:

In step S70: starting from the first stage circuit S$_i$, i=1;

In step S71: receiving an external analog signal V$_{an1}$ which is the analog input signal V$_{in}$(i) of the first stage circuit, and then going to step S72; In step S72: comparing the analog input signal V$_{in}$(i) with a reference signal V$_{ref}$ to generate a first digital output code b$_{2(i)-1}$ and then going to step S73;

In step S73: choosing a first compensation value according to the first digital output code b$_{2(i)-1}$ and then going to step S74;

In step S74: adding the first compensation value to the analog input signal V$_{in}$(i) to generate a first input signal V$_{in1}$(i), and then going to step S75;

In step S75: amplifying the first input signal V$_{in1}$(i) to generate a first output signal V$_{out1}$(i), and then going to step S76;

In step S76: comparing the first input signal V$_{out1}$(i) with the reference signal V$_{ref}$ to generate a second digital output code b$_{2(i)}$, and then going to step S77;

In step S77: choosing a second compensation value according to the first digital output code b$_{2(i)-1}$ and the second digital output code b$_{2(i)}$, and then going to step S78;

In step S78: adding the second compensation value to the analog input signal V$_{in}$(i) to generate a second input signal V$_{in2}$(i), and then going to step S79;

In step S79: amplifying the second input signal V$_{in2}$(i) to generate a second output signal V$_{out2}$(i), and then going to step S80;

In step S80: choosing a third compensation value according to the first digital output code b$_{2(i)-1}$ and the second digital output code b$_{2(i)}$, and then going to step S81;

In step S81: amplifying and adding the third compensation value to the second output signal V$_{out2}$(i) to generate an analog output signal V$_{out}$(i), and then going to step S82;

In step S82: transmitting the analog output signal V$_{out}$(i) to the adjacent next stage circuit S$_{i+1}$ to be the analog input signal V$_{in}$(i+1), and then going to step S83;

In step S83: if the next stage circuit is the final stage circuit (i+1=n), going to step S84; if not, repeating step S72 to step S82;

In step S84: comparing the analog input signal V$_{in}$(n) of the final stage circuit with the reference signal V$_{ref}$ to generate the digital output code b$_{2n-1}$ of the final stage circuit, and go to step S85;

In step S85: combining all 2n–1 digital output codes to generate the outputted digital signal B$_{out}$ corresponding to the analog signal V$_{an1}$.

Sum up the above description, adding a second compensator rather than going through two stage circuits according to the present invention could obtain the digital output code. Thus, the invention reduces the number of amplifiers in an entire converter. This invention decreases the power consumption of the analog-to-digital converter according to the prior art.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A stage circuit for an analog-to-digital converter which comprises a plurality of pipelined stage circuits, the stage circuit comprising:

an amplifier for
   receiving an analog input signal in a sampling mode;
   amplifying a first input signal to generate a first output signal in a first amplifying mode; and
   amplifying a second input signal to generate a second output signal in a second amplifying mode;

a comparator with a predetermined reference signal, for
   comparing the analog input signal with the reference signal to generate a first digital output code in the sampling mode; and
   comparing the first output signal with the predetermined reference signal to generate a second digital output code in the first amplifying mode;

a first compensator for
   adding selectively a first compensation value, according to the first digital output code, to the analog input signal to generate the first input signal in the first amplifying mode; and
   adding selectively a second compensation value, according to the first digital output code and the second digital output code, to the analog input signal to generate the second input signal in the second amplifying mode; and a second compensator for
   choosing a third compensation value according to the first digital output code and the second digital output code, and amplifying and adding the third compensation value to the second output signal to generate an analog output signal to the next stage circuit.

2. The stage circuit of claim 1, wherein the analog-to-digital converter receives an external analog signal, and converts the analog signal via the plurality of pipelined stage circuits to output a corresponding digital signal.

3. The stage circuit of claim 2, wherein the stage circuit receives an analog output signal from an adjacent previous stage circuit to serve as the analog input signal of the stage circuit, and outputs the analog output signal generated by the stage circuit to serve as an analog input signal of the adjacent next stage circuit.

4. The stage circuit of claim 3, wherein the analog-to-digital converter comprises a digital output code combiner for combining the first digital output code and the second output code generated by each stage circuit so that the analog-to-digital converter converts the analog signal to the corresponding digital signal.

5. The stage circuit of claim 4, wherein the analog-to-digital converter comprises a register for temporarily storing the first digital output code and the second output code generated by each stage circuit.

6. The stage circuit of claim 1, wherein the analog-to-digital converter comprises a first compensation table for recording the first compensation value and the second compensation value that the first comparator compensates for the analog input signal.

7. The stage circuit of claim 6, wherein the analog-to-digital converter comprises a second compensation table for recording the third compensation value that the second comparator compensates for the second output signal.

8. The stage circuit of claim 7, wherein the analog-to-digital converter comprises a memory for storing the first compensation table and the second compensation table.

9. The stage circuit of claim 1, wherein the amplifier comprises a gain circuit for selectively deciding the amplification factor of the amplifier in the sampling mode, the first amplifying mode, a second amplifying mode.

10. The stage circuit of claim 9, wherein the gain circuit comprises a plurality of switches and a plurality of capacitors, and the plurality of switches can selectively conduct the plurality of capacitors to decide the amplification factor of the amplifier.

11. A pipelined analog-to-digital converter for receiving an external analog signal, and converting the analog signal via a plurality of pipelined stage circuits to output a digital signal in responsive to the analog signal; the stage circuit comprising an amplifier, a comparator, a first compensator and a second compensator for converting the inputted analog signal via a sampling mode, a first amplifying mode and a second amplifying mode; in the sampling mode, the amplifier being inputted with an analog input signal, the comparator comparing the analog input signal with a reference signal, and then generating a first digital output code; in the first amplifying mode, the first compensator selectively adding a first compensation value to the analog input signal according to the first digital output code, and then generating a first input signal, the amplifier amplifying the first input signal and then generating a first output signal, the comparator comparing the first output signal with the reference signal and then generating a second digital output code; in the second amplifying mode, the first compensator selectively adding a second compensation value to the analog input signal according to the first digital output code and the second digital output code, and then generating a second input signal; the amplifier amplifying the second input signal and then generating a second output signal, the second compensator selectively choosing a third compensation value according to the first digital output code and the second digital output code, and the third compensation value being amplified and added to the second output signal to generate an analog output signal sent to the next stage circuit.

12. The pipelined analog-to-digital converter of claim 11, wherein the analog-to-digital converter comprises a first compensation table for recording the first compensation value and the second compensation value that the first comparator compensates for the analog input signal.

13. The pipelined analog-to-digital converter of claim 12, wherein the analog-to-digital converter comprises a second compensation table for recording the third compensation value that the second comparator compensates for the second output signal.

14. The pipelined analog-to-digital converter of claim 13, wherein the analog-to-digital converter comprises a memory for storing the first compensation table and the second compensation table.

15. The pipelined analog-to-digital converter of claim 11, wherein the amplifier comprises a gain circuit for selectively deciding the amplification factor of the amplifier in the sampling mode, the first amplifying mode, a second amplifying mode.

16. The pipelined analog-to-digital converter of claim 15, wherein the gain circuit comprises a plurality of switches and a plurality of capacitors, and the plurality of switches can selectively conduct the plurality of capacitors to decide the amplification factor of the amplifier.

17. The stage circuit of claim 11, wherein the analog-to-digital converter comprises a digital output code combiner for combining the first digital output code and the second output code generated by each stage circuit so that the analog-to-digital converter converts the analog signal to the corresponding digital signal.

18. The stage circuit of claim 17, wherein the analog-to-digital converter comprises a register for temporarily storing the first digital output code and the second output code generated by each stage circuit.

19. The stage circuit of claim 11, wherein the stage circuit receives an analog output signal from an adjacent previous stage circuit to serve as the analog input signal of the stage circuit, and outputs the analog output signal generated by the stage circuit to serve as an analog input signal of the adjacent next stage circuit.

20. A method of converting an analog signal to a digital signal, the converting method receiving the external analog signal in a pipelined analog-to-digital converter and converting the analog signal via a plurality of pipelined stage circuits to output the corresponding digital signal, the converting method comprising:

receiving an analog input signal in one of the plurality of stage circuits;

comparing the analog input signal with a reference signal to generate a first digital output code;

adding selectively a first compensation value, according to the first digital output code, to the analog input signal to generate the first input signal;

amplifying a first input signal to generate a first output signal;

comparing the first output signal with the reference signal to generate a second digital output code;

adding selectively a second compensation value, according to the first digital output code and the second digital output code, to the analog input signal to generate a second input signal;

amplifying the second input signal to generate a second output signal;

choosing a third compensation value according to the first digital output code and the second digital output code, and amplifying and adding the third compensation value to the second output signal to generate an analog output signal; and transmitting the analog output signal to the adjacent next stage circuit.

21. The converting method of claim 20, wherein the stage circuit comprises a first compensator for adding selectively the first compensation value, according to the first digital output code, to the analog input signal to generate the first input signal in the first amplifying mode; and adding selectively the second compensation value, according to the first digital output code and the second digital output code, to the analog input signal to generate the second input signal in the second amplifying mode.

22. The converting method of claim 21, wherein the stage circuit comprises a second compensator for choosing the third compensation value according to the first digital output code and the second digital output code, and amplifying and adding the third compensation value to the second output signal to generate an analog output signal to the next stage circuit.

23. The converting method of claim 20, wherein the stage circuit comprises an amplifier for receiving the analog input signal in a sampling mode; amplifying the first input signal to generate the first output signal in a first amplifying mode; and amplifying the second input signal to generate the second output signal in a second amplifying mode.

24. The converting method of claim 20, wherein the stage circuit comprises a comparator, pre-storing the reference signal, for comparing the analog input signal with the reference signal to generate the first digital output code in the sampling mode; and comparing the first output signal with the reference signal to generate the second digital output code in the first amplifying mode.

25. The converting method of claim 20, wherein the stage circuit receives an analog output signal from an adjacent previous stage circuit to serve as the analog input signal of the stage circuit, and outputs the analog output signal generated by the stage circuit to serve as an analog input signal of the adjacent next stage circuit.

26. The converting method of claim 20, wherein the analog-to-digital converter comprises a digital output code combiner for combining the first digital output code and the second output code generated by each stage circuit so that the analog-to-digital converter converts the analog signal to the corresponding digital signal.

27. The converting method of claim 20, wherein the analog-to-digital converter comprises a register for temporarily storing the first digital output code and the second output code generated by each stage circuit.

28. A converting method for converting an analog signal to a predetermined (2n-1) digital output codes (b1, b2, b2$n$–1) in a pipelined analog-to-digital converter having a predetermined (n) series stage circuits, the converting method comprising:

executing the following steps in a stage circuit Si, wherein i is a natural number from 1 to (n–1):

I. receiving an analog input signal Vin(i) and comparing with a predetermined reference signal to generate a first digital output code b2$i$–1;

II. subjecting the analog input signal Vin(i) to a sample and hold operation, to an amplification by two, and to add selectively, according to the first digital output code b2$i$–1, a first compensation value as to generate a first output signal Vout1(i);

III. comparing the first output signal Vout1(i) with the reference signal as to generate a second digital output code b2$i$;

IV. subjecting the analog input signal Vin(i) to a sample and hold operation, to an amplification by four, and to add selectively, according to the first digital output code b2$i$–1 and the second output code b2$i$, a second compensation value as to generate a second output signal Vout2(i);

V. adding selectively a third compensation value, according to the first digital output code b2$i$–1 and the second output code b2$i$, to the second output signal Vout2(i) as to generate an analog output signal Vout(i); and VI. transmitting the analog output signal Vout(i) to the adjacent next stage circuit Si+1 to serve as an analog input signal of the next stage circuit Si+1;

repeating the Step(1) to Step(6) from the first stage circuit S1 to the (n–1)-th stage circuit Sn–1 to generate the (2n-2) digital output codes (b1, b2, . . . b2$n$–2); and in the n-th stage circuit Sn, receiving the analog output signal Vout(n–1) of the (n–1)-th stage circuit Sn–1 to serve as the analog input signal Vin(n) of the n-th stage circuit Sn, and comparing the analog input signal Vin(n) with the reference signal to generate the digital output code b2$n$–1.

29. The converting method of claim 28, wherein the analog-to-digital converter comprises a first compensation table for recording the first compensation value and the second compensation value that correspond to the first digital output code and the second digital output code.

30. The pipelined analog-to-digital converter of claim 29, wherein the analog-to-digital converter comprises a second compensation table for recording the third compensation value that correspond to the first digital output code and the second digital output code.

31. The converting method of claim 28, wherein the analog-to-digital converter comprises a digital output code combiner for combining the first digital output code and the second output code generated by each stage circuit so that the analog-to-digital converter converts the analog signal to the corresponding digital signal.

32. The converting method of claim 31, wherein the analog-to-digital converter comprises a register for temporarily storing the first digital output code and the second output code generated by each stage circuit.

* * * * *